United States Patent [19]

Baitz

[11] Patent Number: 5,251,109
[45] Date of Patent: Oct. 5, 1993

[54] HOLDING DEVICE FOR PLUG-IN CARDS

[75] Inventor: Günter Baitz, Krantorweg, Fed. Rep. of Germany

[73] Assignee: Siemens Nixdorf Informationssysteme AG, Fed. Rep. of Germany

[21] Appl. No.: 927,529
[22] PCT Filed: Mar. 14, 1991
[86] PCT No.: PCT/EP91/00477
 § 371 Date: Sep. 21, 1992
 § 102(e) Date: Sep. 21, 1992
[87] PCT Pub. No.: WO91/15102
 PCT Pub. Date: Oct. 3, 1991

[30] Foreign Application Priority Data

Mar. 20, 1991 [DE] Fed. Rep. of Germany ... 9003253[U]

[51] Int. Cl.$^5$ .............................................. H05K 7/18
[52] U.S. Cl. ................................ 361/796; 174/260; 257/678; 361/729; 361/752
[58] Field of Search ............... 361/392, 393, 394, 399, 361/415; 174/260; 439/65, 68; 257/678

[56] References Cited

U.S. PATENT DOCUMENTS

| 4,152,750 | 5/1979 | Bremenour et al. | 361/383 |
| 4,602,829 | 7/1986 | De Andrea | 312/320 |
| 4,609,235 | 9/1986 | Ventura | 312/330 |
| 4,745,524 | 5/1988 | Patton, III | 361/399 |
| 4,821,145 | 4/1989 | Corfits et al. | 361/383 |
| 5,032,951 | 7/1991 | Schropp et al. | 361/391 |
| 5,065,141 | 11/1991 | Whitsitt | 340/635 |
| 5,099,391 | 3/1992 | Maggelet et al. | 361/395 |

FOREIGN PATENT DOCUMENTS

| 0155545 | 9/1985 | European Pat. Off. |
| 0282637 | 9/1988 | European Pat. Off. |
| 2162768 | 6/1973 | Fed. Rep. of Germany |
| 2657732 | 6/1978 | Fed. Rep. of Germany |
| 2910600 | 6/1980 | Fed. Rep. of Germany |
| 3402095 | 8/1985 | Fed. Rep. of Germany |
| 3508463 | 9/1986 | Fed. Rep. of Germany |
| 8628199 | 3/1990 | Fed. Rep. of Germany |
| 2202695 | 9/1988 | United Kingdom |

OTHER PUBLICATIONS

*IBM Technical Disclosure Bulletin*, vol. 30, No. 6, Nov. 1987, "Contact Pressure Device for Personal Computers".

Primary Examiner—Leo P. Picard
Assistant Examiner—Young S. Whang
Attorney, Agent, or Firm—Hill, Steadman & Simpson

[57] ABSTRACT

In a holding device for plug-in cards of an electrical device having a card rack forming a frame-like plug-in connection panel or operating panel, the plug-in cards are mounted in parallel with one another on this card rack by means of the front plates provided at one of their edges. Each front plate carries at least one plug-in connector and/or one operating or display element which is arranged in the area of an aperture in the card rack closed by the respective front plate. At least one aperture (16) is larger than the remaining apertures (12, 14). The front plate (50) provided for this aperture (16) carries at least one plug-in connector (54) and/or one operating or display element in a section of its aperture (16) which is enlarged compared with the other apertures.

5 Claims, 2 Drawing Sheets

HOLDING DEVICE FOR PLUG-IN CARDS

BACKGROUND OF THE INVENTION

1. Field of the Invention

The invention relates to a holding device for plug-in cards of an electrical device comprising a card rack forming a frame-like plug-in connection panel and/or operating panel, on which the plug-in cards are mounted in parallel with one another by means of front plates provided at one of their edges, each front plate carrying at least one plug-in connector and/or one operating or display element which is arranged in the area of an aperture of the card rack which is closed by the respective front plate. A holding device of this type can have a PC format.

2. Description of the Related Art

In recent times, the most essential basic modules of personal computers such as processor, memory and input/output interfaces are used for producing control processors for special purposes. These modules are arranged on so-called plug-in cards with standardized dimensions. The plug-in cards are electrically connected with one another via plug-in connections which are also standardized.

The electrical connection of the plug-in cards to the outside world (screen, keyboard, line connections) or the operation of the device is effected via a front plate arranged at one edge of the plug-in card, on which connecting plugs are arranged and the dimensions of which are also defined. Only the plugs used—the so-called peripheral plugs—are freely selectable. The peripheral plugs or also operating and connecting elements project through apertures in the card rack provided for this purpose and thus form their connecting panel or operating panel. The length and width of the apertures and their position with respect to one another is also standardized.

It is then obvious also to build up the control electronics needed for the above-mentioned special applications on plug-in cards in PC format since a PC card rack is needed in any case for the PC-specific basic modules.

By also using standard PC elements and dimensions for special control systems, there is, however, a risk of a user procuring only the plug-in cards with the special electronics and using these in a commercially available PC. The manufacturer of the special control systems is then deprived of the reward for his efforts which he has expended to adapt the entire control system and not only the special electronics to the specific circumstances.

SUMMARY OF THE INVENTION

It is an object of the invention to specify a holding device into which standard PC and special plug-in cards can be optionally inserted, where the latter should only be usable in this holding device.

In a holding device of the type initially mentioned, the object is achieved by at least one aperture being dimensioned to be larger than the remaining apertures and the front plate provided for this aperture carrying at least one plug-in connector and/or one operating or display element in a section of its aperture enlarged with respect to the other apertures.

These measures make it impossible to use a plug-in card with special electronics in a standard PC without previously changing its card rack mechanically. This is because the boundaries of the standard apertures then cover the offset components at least partially so that they are not usable or counterplugs cannot be inserted.

In a development of the invention, the front plate provided for the enlarged aperture is set back with respect to the card rack and the front plate carries at least one plug-in connector, the counter- plug-in connector of which is larger than the inside size of the non-enlarged apertures. As a result, the counter plug-in connector cannot be plugged through a standard aperture.

In the aforementioned development, it is advantageous if the edges of the front plate are bent up and rest against the card rack. This ensures gapless shielding against electromagnetic radiation or irradiation.

In another development, the aperture which is larger compared with the remaining apertures can be closed by a limiting part in a section creating the enlargement. The latter makes it possible to convert apertures enlarged in the longitudinal direction into standard apertures. One advantage of this measure can be seen in the fact that a single card rack can be used for different applications. An adaptation to the number of standard PC and special plug-in cards is then only achieved by using different limiting parts.

BRIEF DESCRIPTION OF THE DRAWINGS

In the text which follows, the invention will be explained with reference to the drawing, in which.

DETAILED DESCRIPTION OF THE PREFERRED EMBODIMENTS

Figure 1:
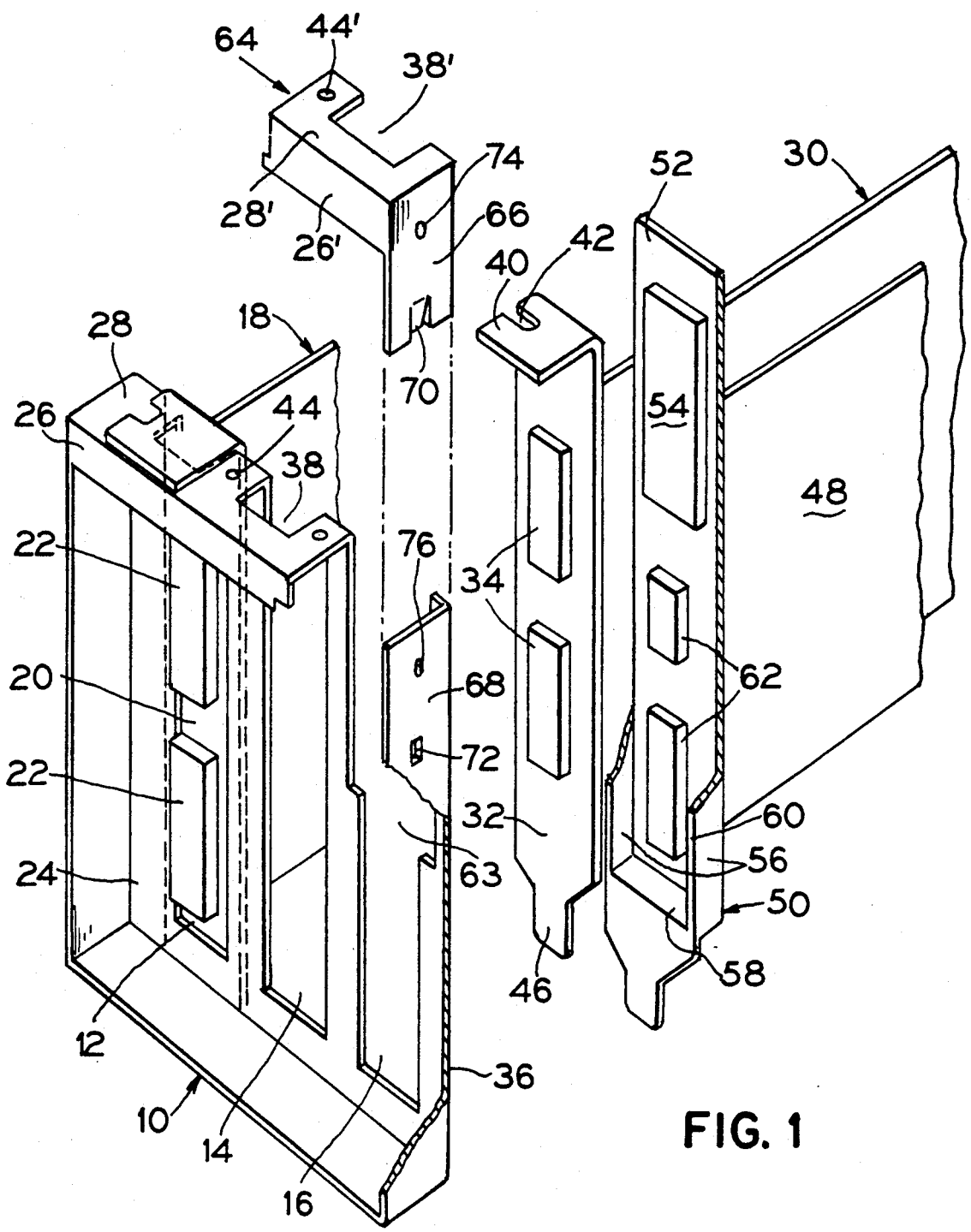
FIG. 1 shows the connection panel of a card rack with standard and special plug-in cards as an exemplary embodiment.

FIG. 1 only shows the connection panel 10 of a card rack provided with three plug-in locations. The connection panel 10 has two standard apertures 12, 14 and an enlarged aperture 16.

The first plug-in location is equipped with a plug-in card 18 with standard front plate 20. The front plate 20 carries plugs 22 which project through the aperture 12. Counterplugs, not shown, can be plugged onto these.

The second plug-in location is unequipped. It can be clearly seen that its standard aperture 14 is bounded by the wall 24 of the connection panel 10 at the bottom and on the side. At the top, the aperture 14 is bounded by a strip 26 extending in parallel with the wall 24. The strip 26 is connected to the wall 24 via an area 28.

A plug-in card which can be plugged into the second plug-in location is designated by 30. On its one narrow-side, it carries a standard front plate 32 which is equipped with two plugs 34. The plug-in card 30 is pushed into the card rack from the top in such a manner that the front plate slides along the inside 36 of the connection panel 10. During this process, the plugs 34 projecting past the front plate 32 slide through a recess 38 in the area 28 into the aperture 14. In this case, the other narrow side of the plug-in card is guided in a slot. The plug-in card 30 is then pushed into the card rack until an upper bent part 40 comes to lie on the area 28. A slot 42 leaves exposed a threaded hole 44 in the area 28. The plug-in card 30 can be fixed at its plug-in location by means of a screw which can be turned into the threaded hole 44.

In the fully inserted position of the plug-in card 30, the front plate 32 comes into contact, by means of a contact tongue 46 formed onto its lower end and in a manner which is known and therefore not shown, with an earth, or ground, contact of the card rack, so that the front plate 32 is also at earth potential. The contact tongue 46 is used, at the same time, for centering the plug-in contacts, not shown, located on the underside of the plug-in card with respect to the counter plugs of the card rack.

The strip 26 does not delimit the aperture 16 of the third plug-in location. This aperture is therefore open at the top. It thus allows a plug-in card 48 with an extended front plate 50 to be inserted.

In the upper area of the front plate front area 52, a plug 54 is arranged. It can be seen that this plug would be covered by the strip 26 if the plug-in card 48 were to be plugged into the second plug-in location, for example. Thus, the plug 54 can only be contacted at those plug-in locations at which the strip 26 is recessed.

The edges of the front plate 50 are provided with bent-up edges 56, 58. In this front plate form, the front faces 60 of the bent-up edges rest against the inside 36 of the connection panel 10 so that the front plate front area 52 is set back from the connection panel at a distance predetermined by the height of the bent-up edges. The plugs 54, 62 are located in the depression formed by the bent-up edges and do not penetrate their aperture in contrast to the plugs 22 of the plug-in card 18. Thus, the counterplugs to be plugged onto the plugs 54, 62 would have to be narrower than the inside width of the aperture 16. This is certainly no problem in the case of the narrower plugs 62 but the plug 54 is much wider. So that a counterplug for it can pass through the aperture 16, the latter is widened in its top area 63. If a plug-in card with a stepped-back front plate front area as in the case of the front plate 50 were to be plugged into a plug-in location with a narrow standard aperture, the plug 54 could not be contacted.

The aperture 16 can be converted into a standard aperture with the aid of a limiting part 64. The limiting part exhibits a strip 26', an area 28' with a hole 44' and a recess 38' so that all guiding and mounting means for a standard PC plug-in card are present.

The limiting part 64 has on its side a tab 66 with the aid of which the limiting part 64 can be mounted on a side wall 68 of the connection panel 10. If the part 64 is in its correct position at the connection panel 10, a projection 70 formed by pressing on the tab 66 engages in a recess 72 in the side wall 68 and a hole 74 in the tab 66 coincides with a threaded hole 76 in a side wall 68. Both parts can now be connected to one another by means of a screw. Naturally, a limiting part for several apertures can also be manufactured.

Figure 2:
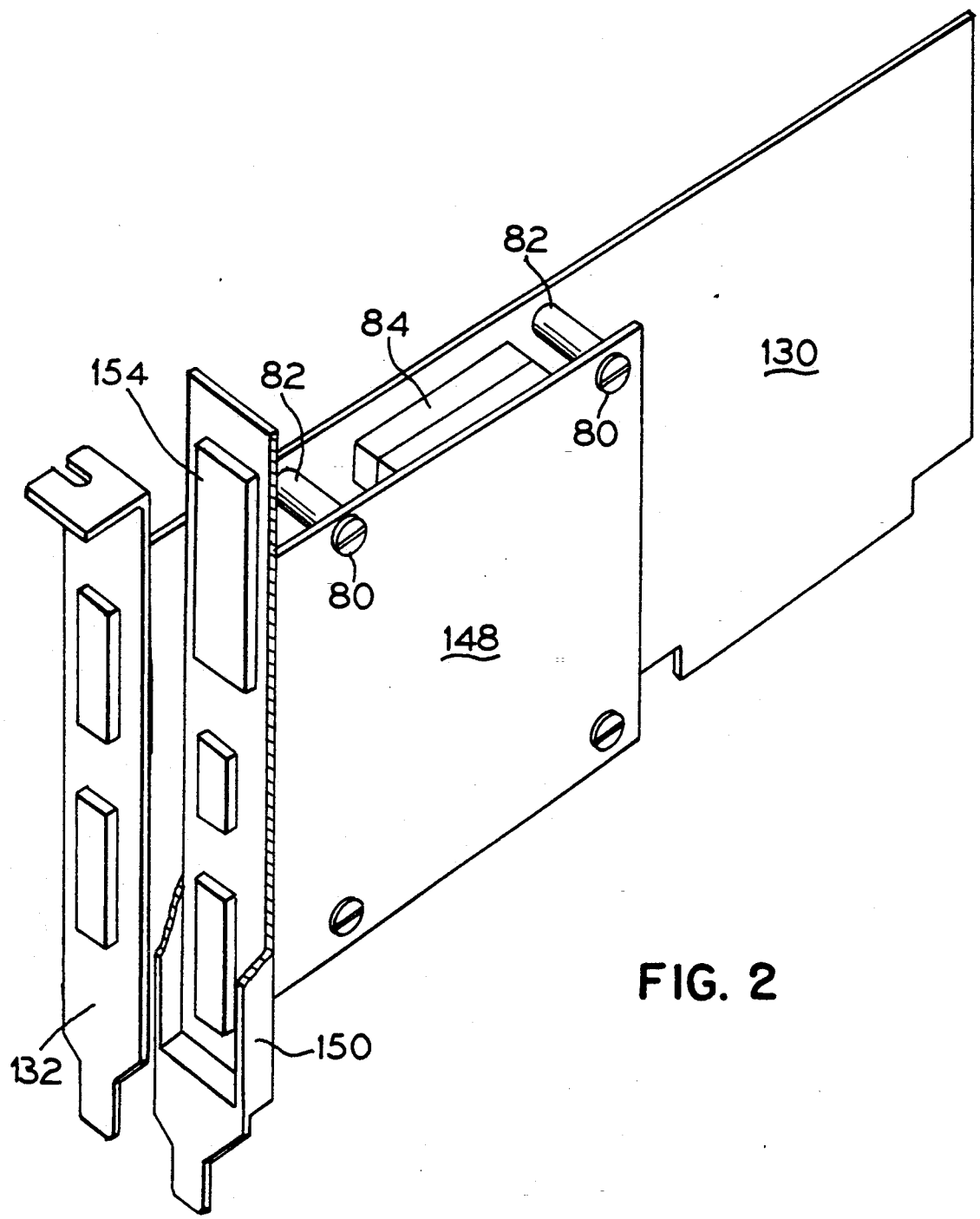
FIG. 2 shows a dual plug-in card for a cash register.

FIG. 2 shows the development of a special plug-in card having two front plates, one of which is constructed as standard front plate 132 and the other one of which is constructed as special front plate 150. The standard front plate 132 is mounted at the front end of a plug-in card 130 having a standard-PC format and the special front plate 150 is mounted on a circuit board 148 having special format.

The circuit board 148 is mounted by means of threaded bolts 80 on the plug-in card 130 in such a manner that both cards are parallel to one another. The distance between them is determined by spacers 82 and corresponds to the distance between two adjacent apertures 14, 16 in the connection panel 10 (FIG. 1). The electrical connection between the cards is established directly via a pair of plug-socket strips 84.

The arrangement according to FIG. 2 is particularly suitable for use in electronic cash registers. In the register control system, a card rack is then arranged which has a connection panel 10 as in FIG. 1. A standard PC processor/memory card is located in the first plug-in location with the aperture 12. The circuit board combination 130, 148 occupies the plug-in locations with apertures 14 and 16 (FIG. 1).

On the plug-in card 130, the control electronics for PC-specific peripheral connections such as remote data transmission, keyboard, screen is arranged. Since these control electronics are not register-specific, this plug-in card also carries a standard front plate. On the circuit board 148, register-specific control circuits are arranged. These include the control circuits for the cash drawer, bar code reader, change dispenser and register printer. These special function controls should only be accessible to the user of a cash register central unit but not to the owner of a standard PC. For this reason, the circuit card 148 is equipped with the special front plate 150. If, for example, the connections for the cash drawer and the register printer are located on the plug 154, these devices cannot be connected if the circuit board 184 is located in a plug-in location with standard aperture.

Although other modifications and changes may be suggested by those skilled in the art, it is the intention of the inventor to embody within the patent warranted hereon all changes and modifications as reasonably and properly come within the scope of his contribution to the art.

I claim:

1. A holding device for plug-in cards of an electric device, comprising:
   a card rack forming a frame-like plug-in connection panel and operating panel,
   plug-in cards mounted on said card rack in parallel with one another by means of front plates provided at one of their edges, each front plate carrying at least one plug-in connector and one operating and display element which is arranged in the area of an aperture of the card rack closed by a respective front plate,
   said card rack defining at least one aperture dimensioned to be larger than remaining apertures and
   the front plate provided for said at least one aperture carrying at least one plug-in connector and one operating or display element in a section of its aperture which is enlarged compared with the other apertures.

2. The holding device as claimed in claim 1, wherein the front plate provided for the enlarged aperture is set back compared with the card rack and the front plate carries at least one plug-in connector, a counter plug-in connector of which is larger than the internal size of an non-enlarged apertures.

3. The holding device as claimed in claim 2, wherein edges of the front plate are bent up and rest against the card rack.

4. The holding device as claimed in claim 1, wherein the aperture which is larger compared with the remaining apertures closed by a limiting part in a section creating the enlargement.

5. The holding device as claimed in claim 4, wherein the limiting part forms a circumferential section of the frame-like card rack.

* * * * *